(12) United States Patent  
Wang et al.

(10) Patent No.: US 11,869,872 B2  
(45) Date of Patent: Jan. 9, 2024

(54) CHIP STACK PACKAGING STRUCTURE AND CHIP STACK PACKAGING METHOD

(71) Applicant: Institute of Semiconductors, Guangdong Academy of Sciences, Guangzhou (CN)

(72) Inventors: Yao Wang, Guangzhou (CN); Yunzhi Ling, Guangzhou (CN); Yinhua Cui, Guangzhou (CN); Chuan Hu, Guangzhou (CN); Zibai Li, Guangzhou (CN); Wei Zhao, Guangzhou (CN); Zhitao Chen, Guangzhou (CN)

(73) Assignee: Institute of Semiconductors, Guangdong Academy of Sciences, Guangzhou (CN)

( * ) Notice: Subject to any disclaimer, the term of this patent is extended or adjusted under 35 U.S.C. 154(b) by 47 days.

(21) Appl. No.: 17/634,081

(22) PCT Filed: Aug. 5, 2021

(86) PCT No.: PCT/CN2021/111018  
§ 371 (c)(1),  
(2) Date: Feb. 9, 2022

(87) PCT Pub. No.: WO2023/010457  
PCT Pub. Date: Feb. 9, 2023

(65) Prior Publication Data  
US 2023/0178514 A1    Jun. 8, 2023

(51) Int. Cl.  
*H01L 23/02*      (2006.01)  
*H01L 25/065*     (2023.01)  
(Continued)

(52) U.S. Cl.  
CPC .... *H01L 25/0652* (2013.01); *H01L 21/76802* (2013.01); *H01L 21/76843* (2013.01);  
(Continued)

(58) Field of Classification Search  
CPC ........... H01L 25/0652; H01L 21/76843; H01L 21/76877; H01L 24/08; H01L 24/50;  
(Continued)

(56) References Cited

U.S. PATENT DOCUMENTS

| | | | |
|---|---|---|---|
| 7,901,989 B2 | 3/2011 | Haba et al. | |
| 2005/0046002 A1* | 3/2005 | Lee | .......................... H01L 24/24 |
| | | | 257/E21.705 |

(Continued)

FOREIGN PATENT DOCUMENTS

| | | |
|---|---|---|
| CN | 101465343 A | 6/2009 |
| CN | 104051337 A | 9/2014 |

(Continued)

OTHER PUBLICATIONS

International Search Report in English from the corresponding Patent Cooperation Treaty (PCT) Application No. PCT/CN2021/111018 completed Apr. 19, 2022.

(Continued)

*Primary Examiner* — Niki H Nguyen  
(74) *Attorney, Agent, or Firm* — Gardner, Linn, Burkhart & Ondersma, LLP

(57) ABSTRACT

A chip stack packaging structure and method includes: a base chip layer, including a base chip with pins on the front surface; at least one stacked chip layer, which is formed on the base chip layer, has an inter-chip insulating layer and at least one stacked chip attached to the insulating layer and pins on the front surface, where the front surface of the stacked chip faces the front surface of the base chip; and a top insulating layer, stacked on the stacked chip layer farthest from the base chip layer. A vertical interconnection hole is formed inside the inter-chip insulating layer to allow the corresponding pins to be communicated vertically so as to be electrically connected. Inside the vertical interconnec- (Continued)

tion hole, a conductive material layer is formed that makes the corresponding pins electrically connected; the stacked chip is thinned and reduced after being attached to the inter-chip insulating layer.

19 Claims, 4 Drawing Sheets

(51) Int. Cl.
*H01L 21/768* (2006.01)
*H01L 23/498* (2006.01)
*H01L 23/00* (2006.01)
*H01L 25/00* (2006.01)

(52) U.S. Cl.
CPC .. *H01L 21/76877* (2013.01); *H01L 23/49827* (2013.01); *H01L 24/08* (2013.01); *H01L 24/80* (2013.01); *H01L 25/50* (2013.01); *H01L 2224/08113* (2013.01); *H01L 2224/08146* (2013.01); *H01L 2224/80896* (2013.01); *H01L 2924/15153* (2013.01)

(58) Field of Classification Search
CPC . H01L 2224/08113; H01L 2224/08146; H01L 2924/15153; H01L 2924/00014; H01L 2924/181; H01L 2224/48091; H01L 2924/01079; H01L 25/0657; H01L 2924/15311; H01L 2924/01029; H01L 2924/01078; H01L 2224/73265; H01L 25/50; H01L 2924/01005; H01L 2224/73204; H01L 2224/0401; H01L 23/481; H01L 24/97; H01L 2924/01082; H01L 2224/32145; H01L 2224/45144; H01L 24/45; H01L 24/81; H01L 24/32; H01L 2224/16145; H01L 24/73; H01L 2224/48247; H01L 2225/06513; H01L 2924/01047; H01L 24/03; H01L 24/11; H01L 24/29; H01L 2924/13091; H01L 24/83; H01L 2924/00012; H01L 2924/01004; H01L 21/6835; H01L 21/78; H01L 2924/01015; H01L 2224/05573; H01L 2924/01019

See application file for complete search history.

(56) References Cited

U.S. PATENT DOCUMENTS

| | | |
|---|---|---|
| 2006/0170112 A1 | 8/2006 | Tanaka et al. |
| 2007/0013066 A1 | 1/2007 | Lin et al. |
| 2007/0037379 A1 | 2/2007 | Enquist et al. |
| 2009/0160065 A1 | 6/2009 | Haba et al. |
| 2013/0026606 A1 | 1/2013 | Farooq et al. |
| 2014/0264862 A1 | 9/2014 | Tsai et al. |
| 2015/0279825 A1 | 10/2015 | Kang et al. |
| 2015/0311188 A1 | 10/2015 | Mao et al. |
| 2017/0005000 A1 | 1/2017 | Beyne |
| 2018/0068984 A1 | 3/2018 | Beyne et al. |

FOREIGN PATENT DOCUMENTS

| | | | |
|---|---|---|---|
| CN | 105529276 A | | 4/2016 |
| CN | 110993518 A | * | 4/2020 |
| CN | 110993518 A | | 4/2020 |
| EP | 3671812 A1 | | 6/2020 |
| JP | 2000208698 A | | 7/2000 |

OTHER PUBLICATIONS

Search Report of Chinese State Intellectual Property Office in corresponding Chinese application CN2021800020855, dated Jul. 13, 2023.

Office Action issued by Chinese State Intellectual Property Office in corresponding Chinese application CN2021800020855, dated Jul. 16, 2023 (Machine Translation).

* cited by examiner

CHIP STACK PACKAGING STRUCTURE AND CHIP STACK PACKAGING METHOD

CROSS REFERENCE TO RELATED APPLICATIONS

The present application claims the priority benefits of International Patent Application No. PCT/CN2021/111018, filed Aug. 5, 2021.

BACKGROUND AND FIELD OF THE INVENTION

This application relates to the field of semiconductor packaging technology, in particular to a chip stack packaging structure and a chip stack packaging method.

In the semiconductor industry, in order to improve the computing power of the chip and make the chip miniaturized, the requirements for the volume and integration of electronic components, such as transistors, diodes, resistors, and capacitors, are getting higher and higher. The current chip size has been as small as nanometers. In addition, the rapid development of artificial intelligence, Internet of Things, 5G, autonomous driving, high-performance cloud computing and other technologies requires the short-distance interconnection of multiple chips.

In order to solve the above problems, 3D integration (three-dimensional integration) technology has received more and more attention. In 3D integration technology, multi-layer chips are stacked in a vertical direction, and the multi-layer chips are interconnected to each other through preformed TSV silicon through holes that penetrate the silicon material, thereby realizing electrical-signal connections between the multi-layer chips. Moreover, in the 3D integration technology, TSV silicon through holes are used to achieve interconnection between multi-layer chips, and for further miniaturization and thinning, the chips are also thinned.

Since TSV silicon through holes are formed in advance on each chip, the TSV silicon through holes on the chips need to be accurately aligned during assembly, which makes the operation complicated. In addition, the thinned chips are fragile, so the handling of ultra-thin chips has become a serious technical problem. Therefore, it causes the cost increase and the difficulty of the alignment of the chips in the vertical direction.

SUMMARY OF THE INVENTION

The present application provides a chip stack packaging structure and method thereof, which can realize ultra-thin multi-chip packaging with high accuracy and low cost.

The present application provides a chip stack packaging structure, including: a base chip layer, including a base chip with pins on the front surface; at least one stacked chip layer, which is sequentially formed on the base chip layer, has an inter-chip insulating layer and at least one stacked chip attached to the inter-chip insulating layer and having a plurality of pins on the front surface, wherein the front surface of the stacked chip faces the front surface of the base chip; and a top insulating layer, stacked on the stacked chip layer farthest from the base chip layer, wherein a vertical interconnection hole is formed inside the inter-chip insulating layer to allow the corresponding pins to be communicated vertically, and the corresponding pins refer to specified pins that need to be electrically connected. Inside the vertical interconnection hole, a conductive material layer is formed that makes the corresponding pins electrically connected; the stacked chip is thinned and reduced after being attached to the inter-chip insulating layer, which exposes part of the area of the pins of the stacked chip, so as to realize the vertical connection of the stacked chip with other chips through the pins.

Optionally, in the above chip stack packaging structure, a barrier layer is further provided in the vertical interconnection hole, and the barrier layer is formed between the inner wall of the vertical interconnection hole and the conductive material layer to prevent the material forming the conductive material layer from entering the inside of the inter-chip insulating layer.

Optionally, in the above chip stack packaging structure, the base chip layer is a wafer or a panel formed by a plurality of base chips.

Optionally, in the above chip stack packaging structure, in a plan view, the base chip and the stacked chip are in predetermined positions such that the corresponding pins are vertically opposed to each other in the stacking direction.

Optionally, in the above chip stack packaging structure, the pins of the base chip are embedded in the inter-chip insulating layer of the stacked chip layer adjacent to the base chip layer, and the pins of the stacked chip are embedded in the inter-chip insulating layer of the stacked chip layer where the stacked chip is located.

Optionally, in the above chip stack packaging structure, the stacked chip layer includes more than two layers.

The present application provides a chip stack packaging method, including: a step of forming a stacked chip layer, forming at least one stacked chip layer on a base chip layer, wherein the stacked chip layer includes an inter-chip insulating layer and at least one stacked chip; a step of thinning and reducing the stacked chip, whenever a stacked chip layer is formed, thinning and reducing the stacked chips included in the stacked chip layer, so as to expose a part of the area of the pins of the stacked chip; a step of forming the vertical interconnection hole, after the step of thinning and reducing the stacked chip, forming a vertical interconnection hole to allow the corresponding pins to be vertically communicated, wherein the corresponding pins refer to specified pins that need to be electrically connected; a step of forming the conductive material layer, forming a conductive material layer that makes the corresponding pins electrically connected in the vertical interconnection hole; and a step of forming a top insulating layer, forming a top insulating layer on the stacked chip layer.

Optionally, in the above chip stack packaging method, between the step of forming the vertical interconnection hole and the step of forming the conductive material layer, a barrier layer forming step of forming a barrier layer in the vertical interconnection hole is further included. The barrier layer is formed by deposition on the inner wall of the vertical interconnection hole to prevent the material forming the conductive material layer from entering the inside of the inter-chip insulating layer in the step of forming the conductive material layer.

Optionally, in the above chip stack packaging method, between the step of forming the conductive material layer and the step of forming a top insulating layer, a judging step is further included to judge whether all the stacked chip layers have been formed: if it is determined in the judging step that the stacked chip layers are not fully formed, returning to the step of forming a stacked chip layer, and if it is determined in the judging step that the stacked chip layers are all formed, entering the step of forming a top insulating layer.

Optionally, in the chip stack packaging method described above, between the step of thinning and reducing the stacked chip and the step of forming the vertical interconnection hole, the method further includes a temporary insulating layer forming step of forming a temporary insulating layer covering the stacked chip on the stacked chip layer.

Optionally, in the chip stack packaging method described above, after the step of forming the conductive material layer, a removal step of removing excess conductive material and all or part of the temporary insulating layer is further included.

Optionally, in the chip stack packaging method described above, the pins of the base chip are embedded in the inter-chip insulating layer of the stacked chip layer adjacent to the base chip layer, and the pins of the stacked chip are embedded in the inter-chip insulating layer of the stacked chip layer where the stacked chip is located.

Optionally, in the chip stack packaging method described above, more than two layers of the stacked chip layers are formed.

BRIEF DESCRIPTION OF THE DRAWINGS

In order to more clearly illustrate technical solutions of the present application, the accompanying drawings are introduced briefly below. It should be understood that the accompanying drawings merely show some embodiments of the present application, and therefore should not be considered as limiting to the scope, and a person ordinarily skilled in the art still could derive other relevant drawings according to these accompanying drawings, without using creative efforts.

DETAILED DESCRIPTION OF THE EMBODIMENTS

Figure 1:
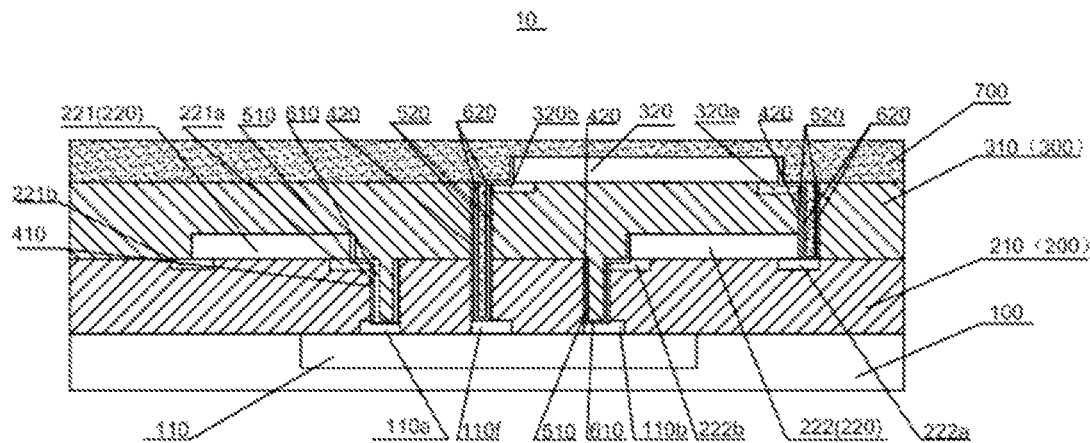
FIG. 1 is a schematic sectional view of a chip stack packaging structure provided by the present application.
Figure 2:
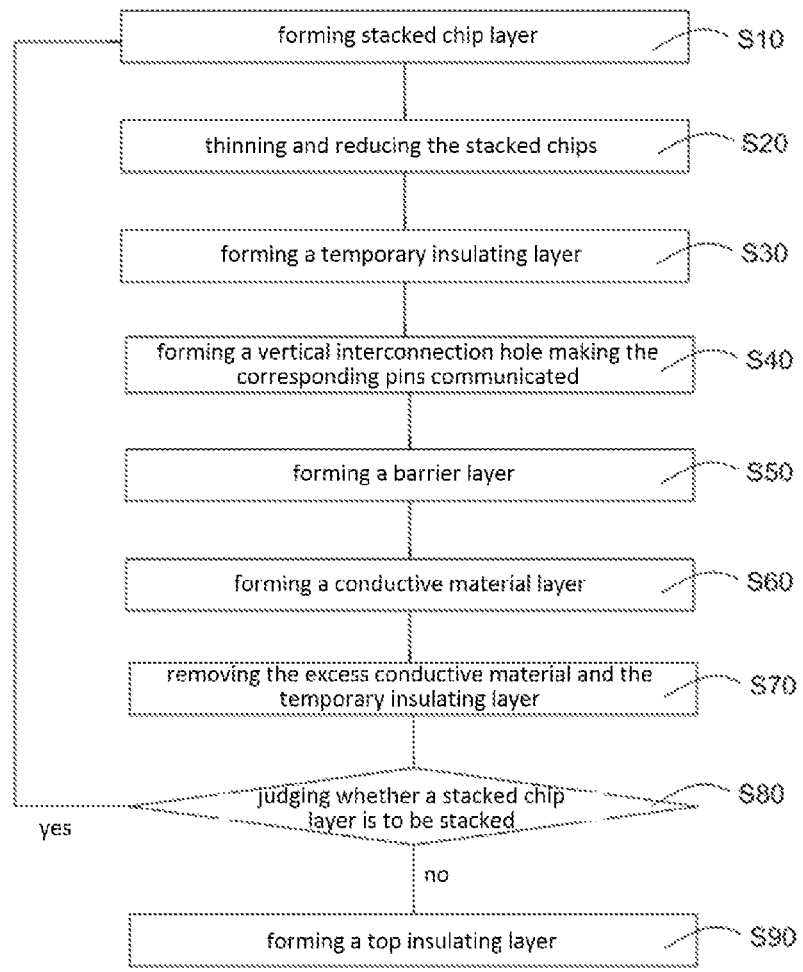
FIG. 2 is a flowchart of the chip stack packaging method provided by the present application.

In order to make the objectives, technical solutions and advantages of the embodiments of the present application clearer, the technical solutions in the embodiments of the present application will be described clearly and completely below in combination with the accompanying drawings of the embodiments of the present application, where the embodiments described are some but not all possible embodiments of the. The components of the embodiments of the present application generally described and shown in the drawings herein may be arranged and designed in various different configurations.

Therefore, the following detailed description of the embodiments of the present application provided in the accompanying drawings is not intended to limit the claimed scope of the present application, but merely represents selected embodiments of the present application. Based on the embodiments in this application, all other embodiments obtained by those of ordinary skill in the art without creative work shall fall within the protection scope of this application.

It should be noted that similar reference numerals and letters indicate similar items in the following drawings. Therefore, once a certain item is defined in one drawing, it does not need to be further defined and explained in the subsequent drawings.

In the description of the present application, it should be indicated that the terms such as "center", "up", "down", "left", "right", "vertical", "horizontal", "inside", and "outside" indicate the orientation or positional relationships shown based on the drawings, or the orientation or positional relationships in which the inventive product is conventionally placed in use, and these terms are intended only to facilitate the description of the present application and simplify the description, but not intended to indicate or imply that the referred devices or elements must be in a particular orientation or constructed or operated in the particular orientation, and therefore should not be construed as limiting the present disclosure. In addition, the terms "first", "second", "third", etc. are only used for distinguishing description, and cannot be understood as indicating or implying relative importance.

In addition, the terms "horizontal", "vertical", "overhanging" and other terms do not mean that the component is required to be absolutely horizontal or overhanging, but may be slightly inclined. For example, "horizontal" only means that its direction is more horizontal than "vertical", it does not mean that the structure must be completely horizontal, but can be slightly inclined.

The terms "include", "comprise", or any other variants thereof are intended to cover non-exclusive inclusion, so that a process, method, article or device that includes a series of elements includes not only those elements, but also other elements that are not explicitly listed, or elements inherent to such process, method, article, or device. If there are no more restrictions, the element defined by the sentence "including a . . . " does not exclude the existence of other identical elements in the process, method, article, or device that includes the element.

First, referring to FIG. 1, a chip stack packaging structure provided by the present application will be described. The chip stack packaging structure may include a base chip layer and a stacked chip layer, may also include a base chip layer and two stacked chip layers, and may also include a base chip layer and three or more stacked chip layers. Here, a case including one base chip layer and two stacked chip layers is taken as an example for description.

FIG. 1 is a schematic sectional view of a chip stack packaging structure 10 including one base chip layer and two stacked chip layers. The packaging structure 10 mainly includes a base chip layer 100, a stacked chip layer 200, a stacked chip layer 300, and a top insulating layer 700 located on the stacked chip layer 300.

The base chip layer 100 may be the base chip 110 (hereinafter, referred to as the chip 110 for short) manufactured by the chip manufacturer, or may be a panel reassembled by the chips 110 formed by cutting the wafer manufactured by the chip manufacturer. The side of the chip on which the circuits or devices are formed is called as the front surface of the chip, that is, the functional side of the chip, and the opposite side thereof is called as the back surface of the chip. The base chip 110 may be one or multiple. FIG. 1 shows a case where there is one base chip. The pins of the chip 110 protrude from the front surface of the chip 110.

The stacked chip layer 200 includes an inter-chip insulating layer 210 (hereinafter, referred to as an insulating layer 210 for short) and a stacked chip 220 (hereinafter, referred to as a chip 220 for short).

There may be one chip 220 or more than two chips. Here, a case where there are two chips, that is, a chip 221 and a chip 222, is shown. The pins of the chip 220 protrude from the front surface of the chip 220. The front surface of the chip 220 is opposite to the front surface of the chip 110, and the corresponding pins of the two chips are vertically opposite. In this case, specifically, the pins 221*a* of the chip 221 are vertically opposite to the pins 110*a* of the chip 110, and the pins 222*b* of the chip 222 are vertically opposite to the pins 110*b* of the chip 110. The mentioned "vertically opposite" includes the case where the two pins completely overlap in the stacking direction and the case where the two pins partially overlap in the stacking direction. The "corresponding pins" mentioned here refer to the specified pins that need to be electrically connected (that is, the electrical connection is required according to the circuit design). FIG. 1 shows a case where the corresponding pins partially overlap in the stacking direction.

The thickness of the chip 220 is 5-50 μm, preferably 5-20 μm, and more preferably 5-10 μm. The thickness of the chip 220 before attached is 100 μm or more. This thickness ensures that the chip has a certain strength and will not be broken due to external force during the attaching operation. After the chip 220 with a thickness of 100 μm or more is attached to the insulating layer 210, the chip 220 is thinned and reduced. Thinning refers to reducing the thickness of the chip, and reducing refers to reducing the planar size of the chip to expose part of the area of the surrounding pins of the chip 220, so as to realize the vertical connection of the chip 220 with other chips through the pins, the method for thinning and reducing can be one or more of mechanical grinding, fine grinding, chemical mechanical polishing, wet chemical etching, and dry etching.

In the case of mechanical thinning, one or more of mechanical grinding, fine grinding, and chemical mechanical polishing can be used. As an example, the packaging structure to which the chip 220 is attached is cut, ground and/or polished on the back surface of the chip 220 through a grinding device or chemical mechanical polishing equipment, thereby reducing the thickness of the chip 220.

In the case that the thinning and reducing is performed by the wet chemical etching, the back surface and/or side edges of the chip 220 are etched by using an etching device and an etching solution to reduce the thickness of the chip 220 and reduce the planar size thereof. Specifically, potassium hydroxide is the main component of the etching solution, and other compounds such as accelerators may also be contained. The entire structure of the packaging structure to which the chip 220 is attached or only the back surface of the chip 220 is immersed in an etching bath containing the above-mentioned chemical etching solution, and the back surface and/or side edges of the chip 220 are etched, for example, the etching is performed by means of a mask, thereby reducing the thickness of the chip 220 and reducing the planar size thereof. In addition, when chemical etching is performed, the etching solution can be stirred or heated, thereby increasing the etching speed and shortening the etching time.

The insulating layer 210 is formed of an insulating material, and can include one or more of organic polymers such as polyimide, benzocyclobutene (BCB), parylene, and epoxy resin. It may be other polymers commonly used in chip packaging, and the thickness of the insulating layer 210 is not particularly limited.

The pins 110*a* to 110*f* of the chip 110 and the pins 221*a*, 221*b*, 222*a*, and 222*b* of the chip 220 are embedded in the insulating layer 210, and inside the insulating layer 210, there are vertical interconnection holes 410 that allow the corresponding pins (here, the pins 110*a* and 221*a*, and the pin 222*b* and the pin 110*b*) to be vertically communicated. Inside the vertical interconnection hole 410, there is a conductive material layer 610 that electrically connects the corresponding pins (pin 110*a* and pin 221*a*, and pin 110*b* and pin 222*b*). There is a barrier layer 510 between the inner wall of the vertical interconnection hole 410 and the conductive material layer 610. The barrier layer 510 is made of a material that can prevent the material forming conductive material layer from diffusing into the insulating layer or the substrate due to deposition, such as material of silicon or $SiO_2$. Examples can include Ta, TaN, etc.

The conductive material layer 610 is formed on the upper surfaces of the pins 110*a*, 110*b*, 221*a*, and 222*b* and the inner wall surface of the barrier layer 510 in the vertical interconnection hole 410, so as to electrically connect the corresponding pins. The material of the conductive material layer 610 may include conductive metal materials such as copper and aluminum, which is not particularly limited here.

There is a stacked chip layer 300 above the stacked chip layer 200. The stacked chip layer 300 includes an inter-chip insulating layer 310 (hereinafter, referred to as an insulating layer 310 for short) and a stacked chip 320 (hereinafter, referred to as a chip 320 for short).

There may be one chip 320, or there may be more than two chips. Here, a case of one chip 320 is shown. The pins of the chip 320 protrude from the front surface of the chip 320. The front surface of the chip 320 faces down, which is opposite to the front surface of the chip 110, the pin 320*b* of the chip 320 is perpendicularly opposite to the pin 110*f*, and the pin 320*a* of the chip 320 is perpendicularly opposite to the pin 222*a* of the chip 222. FIG. 1 shows a case where the corresponding pins partially overlap in the stacking direction.

The thickness of the chip 320 is 5-50 μm, preferably 5-20 μm, and more preferably 5-10 μm. The thickness of the chip 320 before attached is 100 μm or more. This thickness ensures that the chip has a certain strength and will not be broken due to external force during the attaching operation. After the chip 320 with a thickness of 100 μm or more is attached to the insulating layer 310, the chip 320 is thinned and reduced. Thinning refers to reducing the thickness of the chip, and reducing refers to reducing the planar size of the chip to expose part of the area of the surrounding pins of the chip 320, so as to realize the vertical connection of the chip 320 with other chips through the pins, the method for thinning and reducing can be one or more of mechanical grinding, fine grinding, chemical mechanical polishing, wet chemical etching, and dry etching.

The insulating layer 310 is formed of an insulating material, and can include one or more of organic polymers such as polyimide, benzocyclobutene (BCB), parylene, and epoxy resin. It may be other polymers commonly used in chip packaging, and the thickness of the insulating layer 310 is not particularly limited.

The pins of the chip 320 are embedded in the insulating layer 310, and vertical interconnection holes 420 are provided inside the insulating layer 310 and/or the insulating layer 210 to allow the corresponding pins to be vertically communicated, that is, the vertical interconnection hole 420 that allows the pin 110f to vertically communicate with the pin 320b and the vertical interconnection hole 420 that allows the pin 222a to vertically communicate with the pin 320a. Inside the vertical interconnection hole 420, there is a conductive material layer 620 that electrically connects the corresponding pins. There is a barrier layer 520 between the inner wall of the vertical interconnection hole 420 and the conductive material layer 620. The barrier layer 520 is made of a material that can prevent the material forming conductive material layer from diffusing into the insulating layer or the substrate due to deposition, such as material of silicon or $SiO_2$. Examples can include Ta, TaN, etc.

The conductive material layer 620 is formed on the upper surfaces of the pins 320a, 320b, 110f, and 222a and the inner wall surface of the barrier layer 520 in the vertical interconnection hole 420, so as to electrically connect the corresponding pins. The material for forming the conductive material layer 620 may include conductive metal materials such as copper and aluminum, which is not particularly limited here.

The top insulating layer 700 is formed of an insulating material, and can include one or more of organic polymers such as polyimide, benzocyclobutene (BCB), parylene, and epoxy resin. It may be other polymers commonly used in chip packaging, and the thickness of the top insulating layer 700 is not particularly limited.

Next, the chip stack packaging method provided by the present application will be described with reference to FIGS. 2-13. The chip stack packaging method can manufacture a packaging structure that only includes one base chip layer and one stacked chip layer, can manufacture a packaging structure that includes one base chip layer and two stacked chip layers, or can manufacture a packaging structure including one base chip layer and three or more stacked chip layers.

Hereinafter, taking the manufacturing of a packaging structure including one base chip layer and two stacked chip layers as an example, the chip stack packaging method will be specifically described. The chip stack packaging method includes the following steps S10 to S90.

Step S10, forming at least one stacked chip layer on the base chip layer.

The base chip layer 100 may be a wafer or a panel composed of chips. The chip forming the base chip layer 100 is called as the base chip 110 (hereinafter, referred to as the chip 110 for short). In the packaging structure, there may be one chip 110 or more than two chips.

Figure 3:
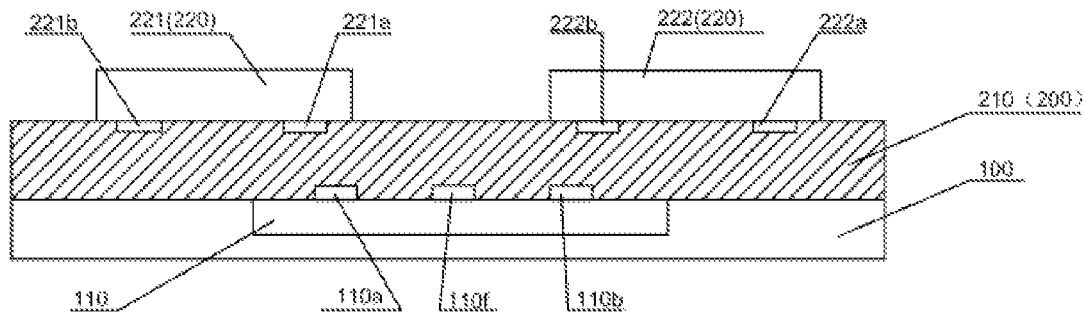
FIG. 3 is a schematic diagram of a step of forming a stacked chip layer.

As shown in FIG. 3, the base chip layer 100 is fixed with the front surface of the chip 110 facing up.

In this specification, the front surface of the chip refers to the surface on the side on which the circuit or device is formed, that is, the functional side of the chip, and the opposite side thereof is called as the back surface of the chip. The chip 110 has a plurality of pins 110a to 110f formed on the front surface and protruding from the front surface, and circuits and/or devices not shown.

The inter-chip insulating layer 210 of the stacked chip layer 200 (hereinafter, referred to as the insulating layer 210 for short) is formed with an insulating material on the fixed base chip layer 100, and the insulating material of the insulating layer 210 can include one or more of organic polymers such as polyimide, benzocyclobutene (BCB), parylene, and epoxy resin. It may be other polymers commonly used in chip packaging, and the insulating material can be a liquid or rolled film insulating material. The method of supplying the insulating material can be spin-coating, spraying, laminating, etc. Here, the thickness of the insulating layer 210 is not particularly limited.

Next, a chip attaching device or the like is used to attach the chip 220 to the surface of the insulating layer 210 with the front surface of stacked chip 220 (hereinafter, referred to as the chip 220 for short) facing down.

The chip 220 may be one or more than one. Here, the case including the chip 221 and the chip 222 is used as an example for description. The chip 221 and the chip 222 are collectively referred to as the chip 220. The chip 220 has a plurality of pins formed on the front surface and circuits and/or devices not shown. In FIG. 3, the pins 221a and 221b of the chip 221, and the pins 222a and 222b of the chip 222 are shown. Like the chip 110, the pins of the chip 220 protrude from the front surface of the chip 220.

The attaching position for the chip 220 is a position determined according to the circuit design, which is a position where the corresponding pins are vertically opposed to each other. At the positions that make the pin 221a of the chip 221 and the pin 110a of the chip 110 vertically opposite to each other and the pin 222b of the chip 222 and the pin 110b of the chip 110 vertically opposite to each other, FIG. 3 shows a case where the corresponding pins partially overlap in the up and down direction.

Step S20, thinning and reducing the stacked chips.

Generally, the thickness of the chip before attached is 100 μm or more. This thickness ensures that the chip has a certain strength and will not be broken due to external force during the attaching operation. However, as the requirements for the miniaturization and thinning of the 3D integrated structure become higher and higher, the thickness of the chip is required to be thinner, and the planar size of the chip is required to be smaller. The planar size of the chip mentioned here refers to the size of the chip when viewed from the top. When the chip is rectangular when viewed from above, it is the length and width dimensions.

Figure 4:
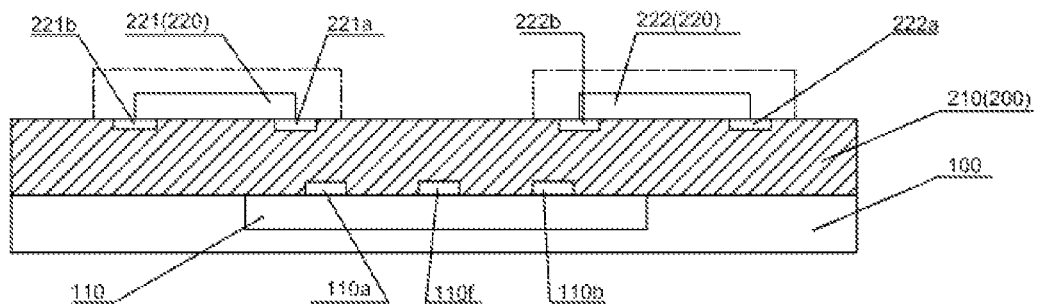
FIG. 4 is a schematic diagram of a step of thinning and reducing the stacked chips.

Here, as shown in FIG. 4, the part surrounded by dotted lines and solid lines of the chip 220 attached to the insulating layer 210 is removed to thin and reduce the chip 220. Thinning refers to reducing the thickness of the chip, and reducing refers to reducing the planar size of the chip to expose part of the area of the surrounding pins of the chip 220, the method for thinning and reducing can be one or more of mechanical grinding, fine grinding, chemical mechanical polishing, wet chemical etching, and dry etching.

In the case of mechanical thinning, one or more of mechanical grinding, fine grinding, and chemical mechanical polishing can be used. As an example, the packaging structure to which the chip 220 is attached is cut, ground and/or polished on the back surface of the chip 220 through a grinding device or chemical mechanical polishing equipment, thereby reducing the thickness of the chip 220.

In the case that the thinning and reducing is performed by the wet chemical etching, the back surface and/or side edges of the chip 220 are etched by using an etching device and an etching solution to reduce the thickness of the chip 220 and reduce the planar size thereof. Specifically, potassium hydroxide is the main component of the etching solution, and other compounds such as accelerators may also be contained. The entire structure of the packaging structure where the chip 220 is attached or only the back surface of the chip 220 is immersed in an etching bath containing the above-mentioned chemical etching solution, and the back surface and/or side edges of the chip 220 are etched, for example, the etching is performed by means of a mask, thereby reducing the thickness of the chip 220 and reducing the planar size thereof. In addition, when chemical etching is performed, the etching solution can be stirred or heated, thereby increasing the etching speed and shortening the etching time.

In addition, since the pins of the chip 220 of the packaging structure formed in step S10 are embedded in the insulating layer 210, the chip 220 can be prevented from falling off due to external force when the mechanical thinning and reducing are performed.

After the mechanical thinning and reducing or the chemical thinning and reducing mentioned above, the thickness of the chip 220 becomes 5-50 µm, preferably 5-20 µm, more preferably 5-10 µm, and the planar size of the chip, viewed from the front view, is reduced so that a part of the pin protrudes from the side of the chip 220.

After the mechanical thinning and reducing or the chemical-etching thinning and reducing, the packaging structure after thinning and reducing is cleaned and dried to remove dust, etching solution, and the like on the packaging structure. Detailed description is omitted here.

Step S30, forming a temporary insulating layer 310 on the stacked chip layer 200.

Figure 5:
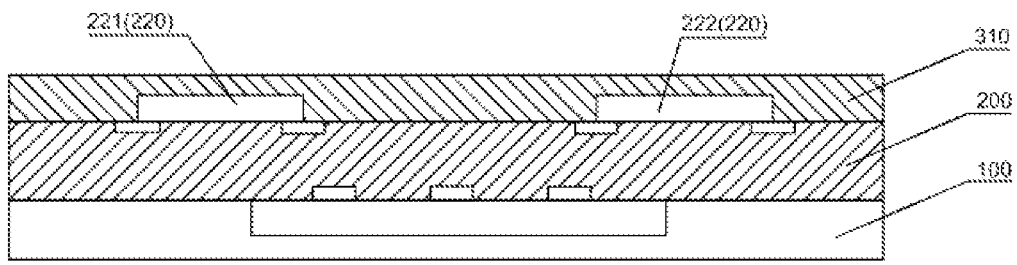
FIG. 5 is a schematic diagram of a step of forming a temporary insulating layer.

As shown in FIG. 5, an insulating material is used to form a temporary insulating layer 310 on the thinned chip 220 (specifically, the chip 221 and the chip 222), and the insulating material constituting the temporary insulating layer 310 can include one or more of organic polymers such as polyimide, benzocyclobutene (BCB), parylene, and epoxy resin, or may be other polymers commonly used in chip packaging, and the insulating material can be a liquid or rolled film insulating material. The method of supplying the insulating material can be spin-coating, spraying, laminating, and other method. Here, the thickness of the temporary insulating layer 310 is not limited.

The temporary insulating layer 310 is formed on the thinned and reduced chip layer 220 to protect the chip 220, thereby preventing the chip 220 from being damaged due to external force during the formation process of the vertical interconnection hole described below.

Step S40, forming a vertical interconnection hole making the corresponding pins communicated.

Figure 6:
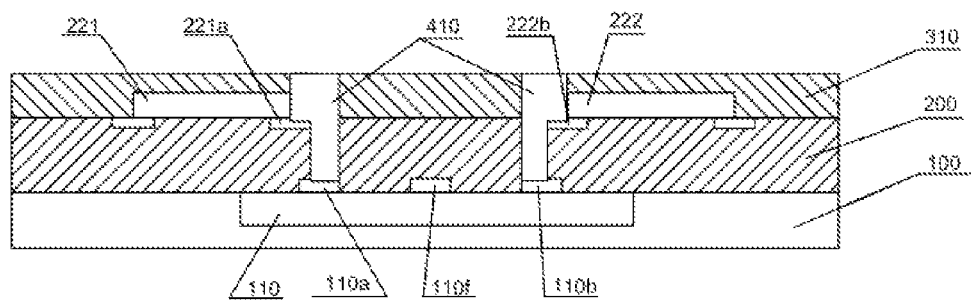
FIG. 6 is a schematic diagram of a step of forming a vertical interconnection hole.

As shown in FIG. 6, using an exposure device, a laser device, or an etching device, through exposure, laser drilling, or dry etching, a vertical interconnection hole 410 is formed at a position where the pin 221a of the chip 221 and the pin 110a of the chip 110 are perpendicularly opposed, from the temporary insulating layer 310, which penetrates to the pin 110a of the chip 110 to allow the pin 221a of the chip 221 to be vertically communicated to the pin 110a of the chip 110, that is, which is the vertical interconnection hole making the corresponding pins communicated. Here, the mentioned "vertically communicated" means that the upper surface and the side surface of the pin 221a of the chip 221 and the upper surface of the pin 110a of the chip 110 are exposed in the vertical interconnection hole. Since exposure, laser drilling, or dry etching are commonly used hole forming methods in the art, it will not be described in detail here. In addition, a vertical interconnection hole 410 is formed so that the corresponding pins, that is, the pin 222b of the chip 222 and the pin 110b of the chip 110, are vertically communicated.

Step S50, forming a barrier layer 510 on the inner wall of the vertical interconnection hole 410.

Figure 7:
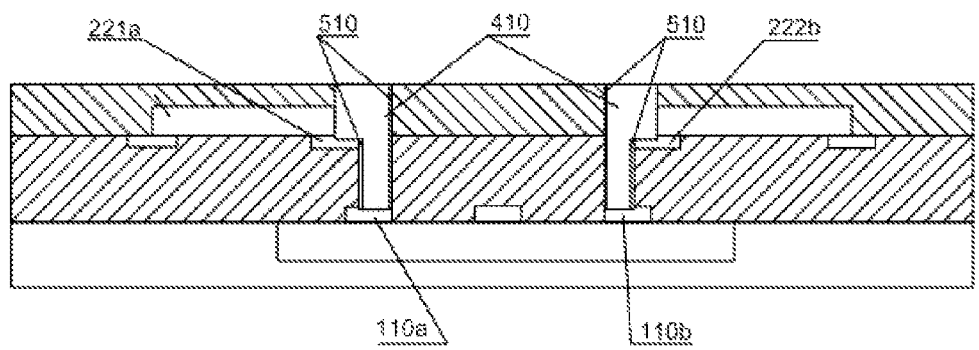
FIG. 7 is a schematic diagram of a step of forming a barrier layer.

In order to prevent the material forming conductive material layer described later from diffusing into the insulating layer or the substrate forming material, such as silicon or $SiO_2$, as shown in FIG. 7, a deposition device known in the art is used to form a barrier layer 510 on the inner wall of the vertical interconnection hole 410 by deposition, and as a material for forming the barrier layer, Ta, TaN, etc. can be adopted. In addition, the thickness of the barrier layer 510 is not particularly limited here, as long as the thickness can block the diffusion of the material forming conductive material layer.

In addition, during the deposition of the barrier layer, a barrier layer is also formed on the surface of the pin 110a, the pin 110b, the pin 221a, and the pin 222b. Here, in order to make the conductive material layer communicate the pin 110a and the pin 221a and communicate the pin 110b and the pin 222b, it is necessary to remove the barrier layer on the surface of the pin 110a, the pin 110b, the pin 221a, and the pin 222b. The method of removing the barrier layer can include exposure, dry etching, and the like.

Step S60, forming a conductive material layer 610 that electrically connects the corresponding pins.

Figure 8:
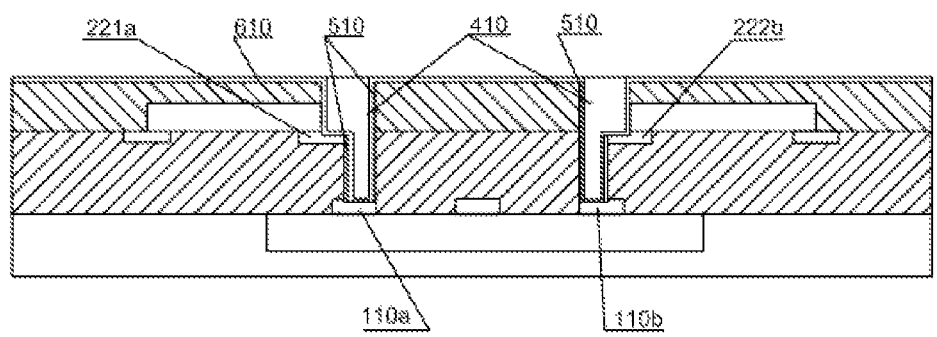
FIG. 8 is a schematic diagram of a step of forming a conductive material layer.

In this step, as shown in FIG. 8, a conductive material layer 610 with a uniform thickness is formed by depositing on the exposed surface of the packaging structure, such as the upper surface of the temporary insulating layer 310, the inner wall surface of the vertical interconnection hole 410 not covered by the barrier layer 510, the surfaces of the pin 110a and the pin 221a exposed from the vertical interconnection hole 410 and the side of the barrier layer 510 by using the deposition device known in the art. The material forming the conductive material layer can include conductive metal materials such as copper and aluminum, which is not particularly limited here. The thickness of the conductive material layer 610 is not particularly limited, as long as the thickness can electrically conduct the corresponding pins. The conductive material may be filled in the interconnection hole space completely, or may only realize the interconnection of the corresponding pins without filling the interconnection hole space completely, and the remaining space can be filled by the next insulating layer material.

Step S70, removing the excess conductive material and the temporary insulating layer 310.

Figure 9:
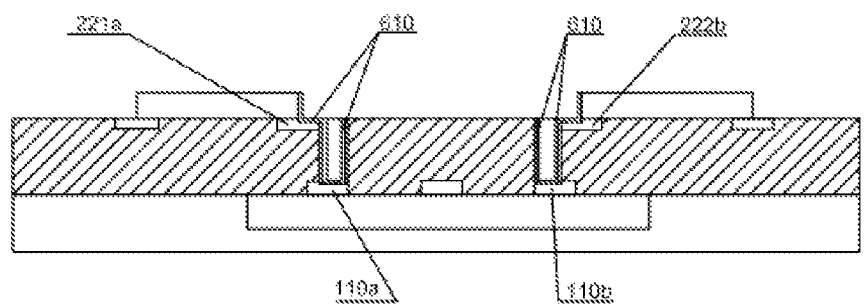
FIG. 9 is a schematic diagram of a laminated structure after removing the excess conductive material and the temporary insulating layer.

The conductive material only needs to electrically conduct the corresponding pins. In order to avoid short circuits and other defects caused by the excess conductive material, the excess conductive material needs to be removed. In addition, the temporary insulating layer 310 may be completely removed or partially removed. In addition, the temporary insulating layer 310 may not be removed and may be used as an insulating layer described later. FIG. 9 shows a case where the temporary insulating layer 310 is completely removed.

Step S80, judging whether a stacked chip layer is to be formed, if yes, returning to step S10, and if there is no need to form a stacked chip layer, then going to step S90.

Here, since a packaging structure having two stacked chip layers is to be formed, it is judged as yes in step S80, and returned to step 10.

Figure 10:
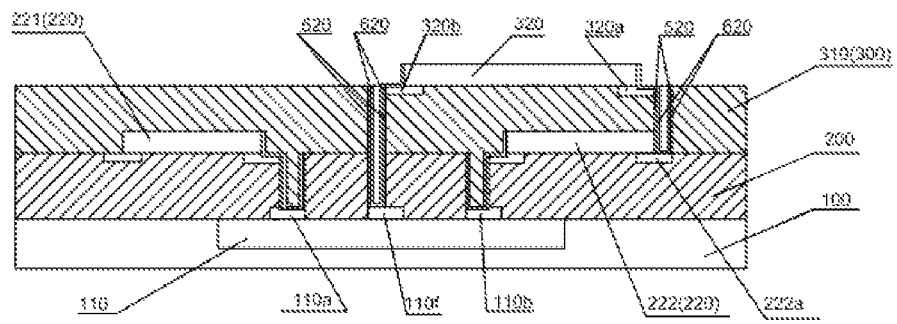
FIG. 10 is a schematic diagram of a laminated structure in which a second stacked chip layer is formed.

In FIG. 10, the packaging structure in which the second-layer stacked chip layer 300 is formed is shown, and the illustration of each step of the second-layer stacked chip layer 300 is omitted, and the description will be made with reference to FIGS. 3 to 10 together.

In step S10, with the packaging structure formed in step S70, the inter-chip insulating layer 310 (hereinafter, referred to as the insulating layer 310 for short) of the stacked chip layer 300 is formed with an insulating material on the side away from the base chip layer 100. Regarding the insulating material and forming method of the insulating layer 310, except that the insulating material of the insulating layer 310 enters the inner side of the conductive material layer 610, it is the same as the insulating layer 210, and detailed description is omitted here.

Next, a chip attaching device is used to attach the chip 320 to the insulating layer 310 with the front surface of stacked chip 320 (hereinafter, referred to as the chip 320 for short) facing down. There may be one chip 320 or multiple chips. Here, the case of one chip 320 is taken as an example for description. The chip 320 has a plurality of pins formed on the front surface and circuits and/or devices not shown. The area of the chip 320 where the circuits and/or devices are formed is in an area surrounded by the plurality of pins, the pin 320a and pin 320b of the chip 320 are shown in FIG. 10. Like the chip 110, the pins of the chip 320 protrude from the front surface of the chip 320.

The attaching position of the chip 320 is a position determined according to the circuit design, such that the pin 320b is perpendicularly opposite to the pin 110f and the pin 320a is perpendicularly opposite to the pin 222a.

The attaching method of the chip 320 is the same as that of the chip 220, and a detailed description is omitted here.

Next, in step S20, the chip 320 is thinned and reduced. Similar to the thinning and reducing for the chip 220, after the mechanical thinning and reducing or the chemical thinning and reducing, the thickness of the chip 320 becomes 5-50 µm, preferably 5-20 µm, and more preferably 5-10 µm, wherein the reducing refers to reducing the planar size of the chip 320 to expose part of the area of the surrounding pins of the chip 320.

Then, in step S30, a temporary insulating layer is formed on the second-layer stacked chip layer 300. The material and method of forming the temporary insulating layer are the same as those of the temporary insulating layer 310, and the description is omitted here.

In step S40, a vertical interconnection hole communicating the pin 320b and the pin 110f and a vertical interconnection hole communicating the pin 320a and the pin 222a are formed respectively. The steps of forming the vertical interconnection hole are the same as those of the vertical interconnection hole 410, and the description is omitted here.

Then, in step S50, a barrier layer 520 is formed on the inner wall of the vertical interconnection hole. This step is the same as the step of forming the barrier layer 510, and the description is omitted here. Next, in step S60, a conductive material layer 620 that electrically connects the corresponding pins is formed. This step is the same as the step of forming the conductive material layer 610, and the description is omitted here.

Next, in step S70, the excess conductive material and the temporary insulating layer are removed, thereby forming the packaging structure shown in FIG. 10.

Next, in step S80, it is determined whether a stacked chip layer is to be formed. It is judged that there is no need to form a stacked chip layer again, and step S90 is entered.

In step S90, an insulating layer 700 as a top insulating layer is formed on the stacked packaging structure.

The forming material and forming method of the insulating layer 700 of the top insulating layer are substantially the same as those of the insulating layer of the stacked chip layer, thereby obtaining the chip stack packaging structure shown in FIG. 1.

The chip stack packaging structure obtained by the chip stack packaging method of this embodiment can be connected with other electronic components by further forming a connection layer.

The present application provides a chip stack packaging structure, including: a base chip layer, including a base chip with pins on the front surface; at least one stacked chip layer, which is sequentially formed on the base chip layer, has an inter-chip insulating layer and at least one stacked chip attached to the inter-chip insulating layer and having a plurality of pins on the front surface, wherein the front surface of the stacked chip faces the front surface of the base chip; and a top insulating layer, stacked on the stacked chip layer farthest from the base chip layer, wherein a vertical interconnection hole is formed inside the inter-chip insulating layer to allow the corresponding pins to be communicated vertically, and the corresponding pins refer to specified pins that need to be electrically connected. Inside the vertical interconnection hole, a conductive material layer is formed that makes the corresponding pins electrically connected; the stacked chip is thinned and reduced after being attached to the inter-chip insulating layer, which exposes part of the area of the pins of the stacked chip, so as to realize the vertical connection of the stacked chip with other chips through the pins. Since the stacked chip is thinned and reduced after being attached on the inter-chip insulating layer, it is a relatively thick chip with a certain strength during the chip attaching operation, which can prevent the chip from being broken by external force from the manipulator during the attaching operation, thereby being able to provide an ultra-thin chip stack packaging structure with high yield and low cost.

The present application provides a chip stack packaging method, including: a step of forming a stacked chip layer, forming at least one stacked chip layer on a base chip layer, wherein the stacked chip layer includes an inter-chip insulating layer and at least one stacked chip; a step of thinning and reducing the stacked chip, whenever a stacked chip layer is formed, thinning and reducing the stacked chips included in the stacked chip layer, so as to expose a part of the area of the pins of the stacked chip; a step of forming the vertical interconnection hole, after the step of thinning and reducing the stacked chip, forming a vertical interconnection hole to allow the corresponding pins to be vertically communicated, wherein the corresponding pins refer to specified pins that need to be electrically connected; a step of forming the conductive material layer, forming a conductive material layer that makes the corresponding pins electrically connected in the vertical interconnection hole; and a step of forming a top insulating layer, forming a top insulating layer on the stacked chip layer. Since each stacked chip layer is formed, the stacked chips included in the stacked chip layer are thinned and reduced, it is a relatively thick chip with a certain strength during the chip attaching operation, which can prevent the chip from being broken by external force from the manipulator during the attaching operation, thereby being able to achieve an ultra-thin chip stack packaging method with high yield and low cost.

The above are only the various embodiments of the present application, but the protection scope of the present application is not limited thereto. Any person skilled in the art can easily think of changes or substitutions within the technical scope disclosed in the present application, which all should be covered within the scope of protection of this application. Therefore, the protection scope of this application shall be subject to the protection scope of the claims.

The chip stack packaging structure and method provided in the present application are applied to the field of three-dimensional integrated packaging technology, and can achieve ultra-thin multi-chip stack packaging with high accuracy and low cost.

What is claimed is:

1. A chip stack packaging structure, comprising:
   a base chip layer, comprising a base chip having pins on a front surface;
   at least one stacked chip layer, which is sequentially formed on the base chip layer, has an inter-chip insulating layer and at least one stacked chip attached to the inter-chip insulating layer and having a plurality of pins on a front surface, wherein the front surface of the at least one stacked chip faces the front surface of the base chip; and
   a top insulating layer, stacked on a stacked chip layer farthest from the base chip layer,
   wherein a vertical interconnection hole is formed inside the inter-chip insulating layer to allow corresponding pins to be communicated vertically, wherein the corresponding pins refer to specified pins that need to be electrically connected,
   inside the vertical interconnection hole, a conductive material layer is formed, which makes the corresponding pins electrically connected,
   and the at least one stacked chip is thinned and reduced after attached to the inter-chip insulating layer, so as to expose a part of area of pins of the at least one stacked chip, so as to realize a vertical connection of the at least one stacked chip with other chips through the pins;
   wherein the pins of the base chip are embedded in the inter-chip insulating layer of the at least one stacked chip layer adjacent to the base chip layer, and the pins of the at least one stacked chip are embedded in an inter-chip insulating layer of a stacked chip layer where the at least one stacked chip is located.

2. The chip stack packaging structure according to claim 1, wherein a barrier layer is further provided in the vertical interconnection hole, and the barrier layer is formed between an inner wall of the vertical interconnection hole and the conductive material layer, so as to prevent a material forming the conductive material layer from entering an inside of the inter-chip insulating layer.

3. The chip stack packaging structure according to claim 1, wherein the base chip layer is a wafer or a panel formed by a plurality of base chips.

4. The chip stack packaging structure according to claim 1, wherein in a plan view, the base chip and the at least one stacked chip are in predetermined positions such that the corresponding pins are vertically opposed to each other in a stacking direction.

5. The chip stack packaging structure according to claim 1, wherein the at least one stacked chip layer is provided in a number of two or more.

6. A chip stack packaging method, comprising:
   a step of forming a stacked chip layer, forming at least one stacked chip layer on a base chip layer, wherein the at least one stacked chip layer comprises an inter-chip insulating layer and at least one stacked chip;
   a step of thinning and reducing the at least one stacked chip, thinning and reducing at least one stacked chip comprised in a stacked chip layer each time the stacked chip layer is formed, so as to expose a part of area of pins of the at least one stacked chip;
   a step of forming a vertical interconnection hole, after the step of thinning and reducing the at least one stacked chip, forming the vertical interconnection hole to allow corresponding pins to be vertically communicated, wherein the corresponding pins refer to specified pins that need to be electrically connected;
   a step of forming a conductive material layer, forming the conductive material layer that makes the corresponding pins electrically connected in the vertical interconnection hole; and
   a step of forming a top insulating layer, forming the top insulating layer on the at least one stacked chip layer.

7. The chip stack packaging method according to claim 6, further comprising a barrier layer forming step of forming a barrier layer in the vertical interconnection hole between the step of forming a vertical interconnection hole and the step of forming a conductive material layer, wherein the barrier layer is formed by deposition on an inner wall of the vertical interconnection hole, so as to prevent a material forming the conductive material layer from entering an inside of the inter-chip insulating layer in the step of forming a conductive material layer.

8. The chip stack packaging method according to claim 6, further comprising a judging step to judge whether all stacked chip layers have been formed between the step of forming a conductive material layer and the step of forming a top insulating layer, wherein if it is determined in the judging step that the stacked chip layers are not fully formed, it is returned to the step of forming a stacked chip layer, and if it is determined in the judging step that the stacked chip layers are all formed, it is entered the step of forming a top insulating layer.

9. The chip stack packaging method according to claim 6, further comprising a temporary insulating layer forming step of forming a temporary insulating layer covering the at least one stacked chip on the at least one stacked chip layer between the step of thinning and reducing the at least one stacked chip and the step of forming a vertical interconnection hole.

10. The chip stack packaging method according to claim 9, further comprising a removal step of removing excess conductive material and all or part of the temporary insulating layer after the step of forming a conductive material layer.

11. The chip stack packaging method according to claim 6, wherein pins of the base chip are embedded in an inter-chip insulating layer of a stacked chip layer adjacent to the base chip layer, and pins of the at least one stacked chip are embedded in a inter-chip insulating layer of a stacked chip layer where the at least one stacked chip is located.

12. The chip stack packaging method according to claim 6, wherein two or more stacked chip layers are formed.

13. The chip stack packaging structure according to claim 2, wherein the base chip layer is a wafer or a panel formed by a plurality of base chips.

14. The chip stack packaging structure according to claim 2, wherein in a plan view, the base chip and the at least one stacked chip are in predetermined positions such that the corresponding pins are vertically opposed to each other in a stacking direction.

15. The chip stack packaging structure according to claim 2, wherein the pins of the base chip are embedded in an inter-chip insulating layer of a stacked chip layer adjacent to the base chip layer, and the pins of the at least one stacked chip are embedded in an inter-chip insulating layer of a stacked chip layer where the at least one stacked chip is located.

16. The chip stack packaging structure according to claim 2, wherein the at least one stacked chip layer is provided in a number of two or more.

17. The chip stack packaging method according to claim 7, further comprising a judging step to judge whether all stacked chip layers have been formed between the step of forming a conductive material layer and the step of forming a top insulating layer, wherein if it is determined in the judging step that the stacked chip layers are not fully formed, it is returned to the step of forming a stacked chip layer, and if it is determined in the judging step that the stacked chip layers are all formed, it is entered the step of forming a top insulating layer.

18. The chip stack packaging method according to claim 7, further comprising a temporary insulating layer forming step of forming a temporary insulating layer covering the at least one stacked chip on the at least one stacked chip layer between the step of thinning and reducing the at least one stacked chip and the step of forming a vertical interconnection hole.

19. The chip stack packaging method according to claim 7, wherein pins of the base chip are embedded in an inter-chip insulating layer of a stacked chip layer adjacent to the base chip layer, and pins of the at least one stacked chip are embedded in a inter-chip insulating layer of a stacked chip layer where the at least one stacked chip is located.

\* \* \* \* \*